(12) United States Patent
Weidner et al.

(10) Patent No.: US 9,159,889 B2
(45) Date of Patent: Oct. 13, 2015

(54) RADIATION-EMITTING COMPONENT AND METHOD FOR PRODUCING RADIATION-EMITTING COMPONENTS

(75) Inventors: Karl Weidner, München (DE); Johann Ramchen, Altdorf (DE); Axel Kaltenbacher, Mintraching (DE); Walter Wegleiter, Nittendorf (DE); Bernd Barchmann, Regensburg (DE); Stefan Gruber, Bad Addach (DE); Georg Bogner, Lappersdorf (DE)

(73) Assignee: OSRAM Opto Semiconductors GmbH (DE)

( * ) Notice: Subject to any disclaimer, the term of this patent is extended or adjusted under 35 U.S.C. 154(b) by 109 days.

(21) Appl. No.: 13/811,846

(22) PCT Filed: Jul. 15, 2011

(86) PCT No.: PCT/EP2011/062157
§ 371 (c)(1),
(2), (4) Date: Mar. 18, 2013

(87) PCT Pub. No.: WO2012/010519
PCT Pub. Date: Jan. 26, 2012

(65) Prior Publication Data
US 2013/0207139 A1 Aug. 15, 2013

(30) Foreign Application Priority Data
Jul. 23, 2010 (DE) .................. 10 2010 032 041

(51) Int. Cl.
*H01L 33/60* (2010.01)
*H01L 33/20* (2010.01)
(Continued)

(52) U.S. Cl.
CPC ............. *H01L 33/60* (2013.01); *H01L 33/20* (2013.01); *H01L 33/38* (2013.01); *H01L 33/58* (2013.01);
(Continued)

(58) Field of Classification Search
None
See application file for complete search history.

(56) References Cited

U.S. PATENT DOCUMENTS

| 6,897,488 B2 | 5/2005 | Baur et al. |
|---|---|---|
| 7,135,711 B2 | 11/2006 | Linder et al. |

(Continued)

FOREIGN PATENT DOCUMENTS

| CN | 1779530 | 5/2006 |
|---|---|---|
| DE | 201 19 230 | 2/2002 |

(Continued)

OTHER PUBLICATIONS

I. Schnitzer et al., "30% external quantum efficiency from surface textured, thin-film light-emitting diodes," Appl. Phys. Lett., vol. 63, No. 16, Oct. 18, 1993, pp. 2174-2176.

(Continued)

*Primary Examiner* — Fernando L Toledo
*Assistant Examiner* — Valerie N Newton
(74) *Attorney, Agent, or Firm* — DLA Piper LLP (US)

(57) ABSTRACT

A radiation-emitting component includes a semiconductor chip which has a first main surface, a second main surface on an opposite side from the first main surface and an active region that generates radiation; a carrier on which the semiconductor chip is fixed on the side of the second main surface; an output layer arranged on the first main surface of the semiconductor chip and forming a lateral output surface spaced apart from the semiconductor chip in a lateral direction, a recess tapering in a direction of the semiconductor chip being, formed in the output layer and deflecting radiation emerging from the first main surface during operation into the direction of the lateral output surface.

6 Claims, 8 Drawing Sheets

(51) Int. Cl.
- *H01L 33/38* (2010.01)
- *H01L 33/58* (2010.01)
- *G02F 1/1335* (2006.01)
- *H01L 25/075* (2006.01)
- *H01L 33/40* (2010.01)
- *H01L 33/46* (2010.01)

(52) U.S. Cl.
CPC ....... *G02F 1/133603* (2013.01); *H01L 25/0753* (2013.01); *H01L 25/0756* (2013.01); *H01L 33/405* (2013.01); *H01L 33/46* (2013.01); *H01L 2924/0002* (2013.01)

(56) References Cited

U.S. PATENT DOCUMENTS

| | | |
|---|---|---|
| 7,205,578 B2 | 4/2007 | Eisert et al. |
| 7,282,741 B2 | 10/2007 | Kim et al. |
| 7,566,148 B2 | 7/2009 | Noh et al. |
| 7,777,236 B2 | 8/2010 | Pachler |
| 2004/0046179 A1* | 3/2004 | Baur et al. ............ 257/98 |
| 2006/0118805 A1 | 6/2006 | Camras et al. |
| 2007/0029555 A1 | 2/2007 | Lester et al. |
| 2007/0086211 A1 | 4/2007 | Beeson et al. |
| 2007/0145402 A1 | 6/2007 | Eisert et al. |
| 2008/0006840 A1 | 1/2008 | Camras et al. |
| 2008/0128725 A1 | 6/2008 | Hsing Chen et al. |
| 2008/0254558 A1 | 10/2008 | Han et al. |
| 2011/0006324 A1* | 1/2011 | Wirth ............ 257/98 |

FOREIGN PATENT DOCUMENTS

| | | |
|---|---|---|
| DE | 201 19 230 U1 | 2/2002 |
| DE | 10 2004 053 116 A1 | 5/2006 |
| DE | 10 2007 062 040 A1 | 6/2009 |
| DE | 10 2008 014 094 A1 | 9/2009 |
| EP | 1 367 656 A2 | 12/2003 |
| JP | 2001-185762 | 7/2001 |
| JP | 2005-353875 | 12/2005 |
| JP | 2007-242820 | 9/2007 |
| JP | 2009-71265 | 4/2009 |
| JP | 2010-40894 | 2/2010 |
| WO | 01/07828 A1 | 2/2001 |
| WO | 01/61765 A1 | 8/2001 |
| WO | 02/37578 A1 | 5/2002 |
| WO | 2009/093498 A1 | 7/2009 |
| WO | 2009/107661 A1 | 9/2009 |

OTHER PUBLICATIONS

An English translation of Japanese Examination Report dispatched Jan. 27, 2014 for corresponding Japanese Patent Application No. 2013-521057.

Taiwanese Examination Report dated Feb. 21, 2014 for corresponding Taiwanese Application No. 100125782.

English translation of corresponding Office Action of Chinese Application No. 201180036037.4 dated Dec. 29, 2014.

* cited by examiner

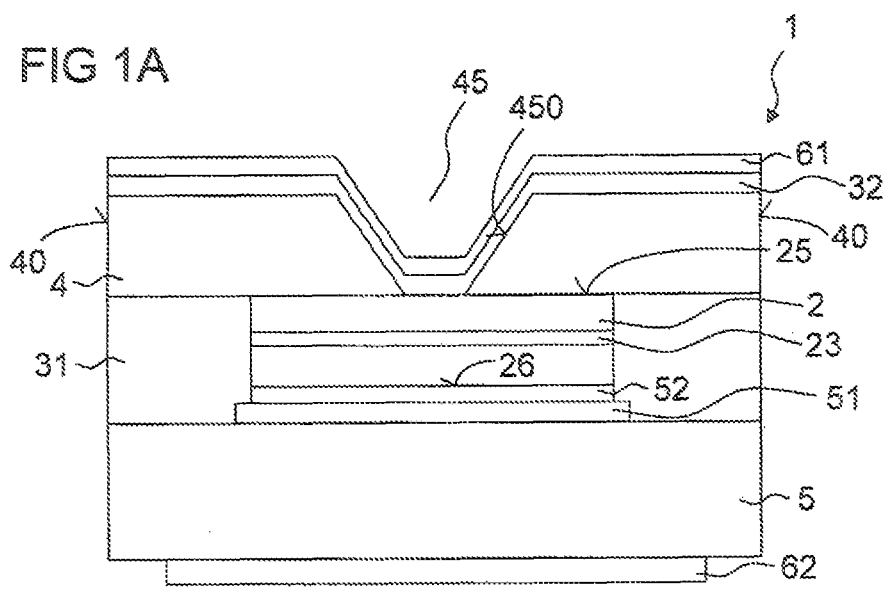
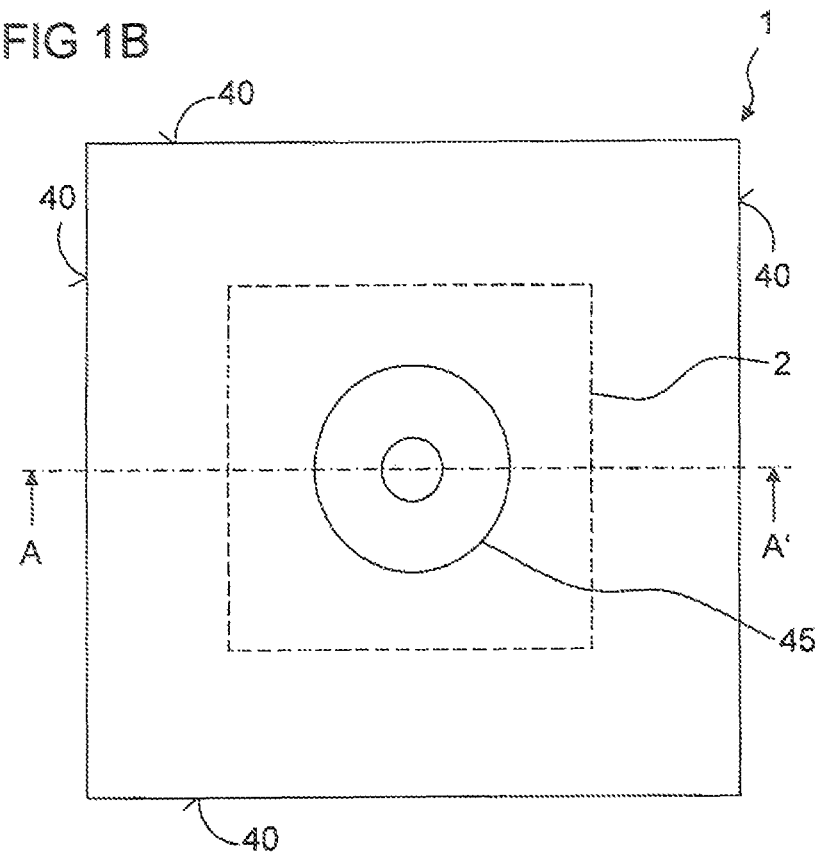

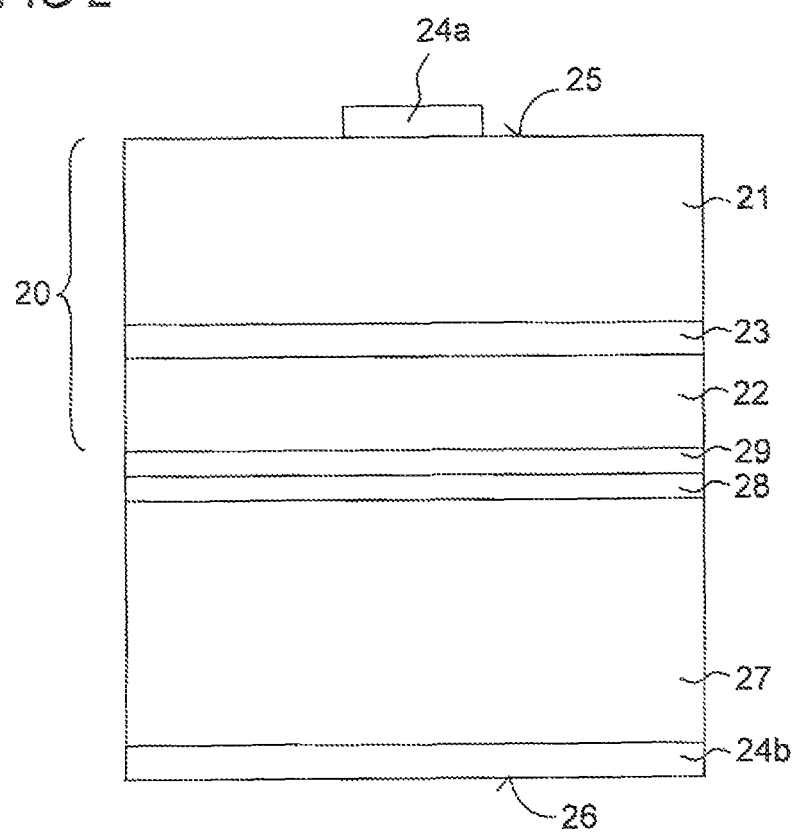

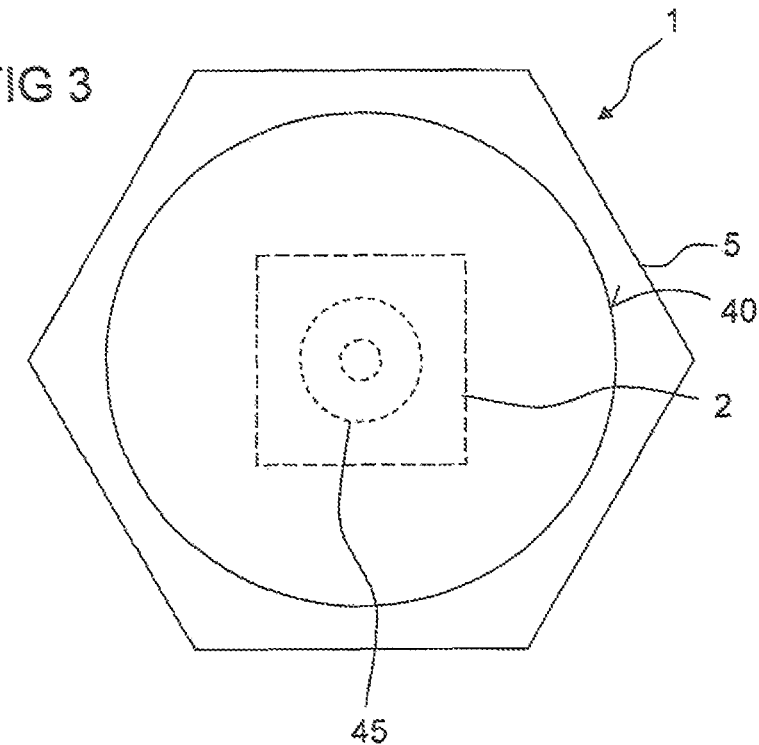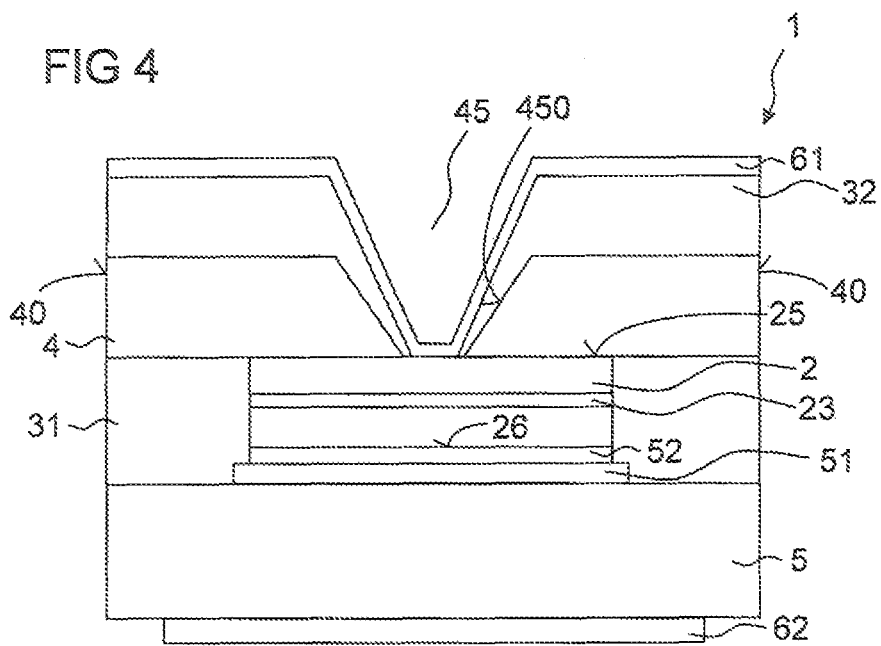

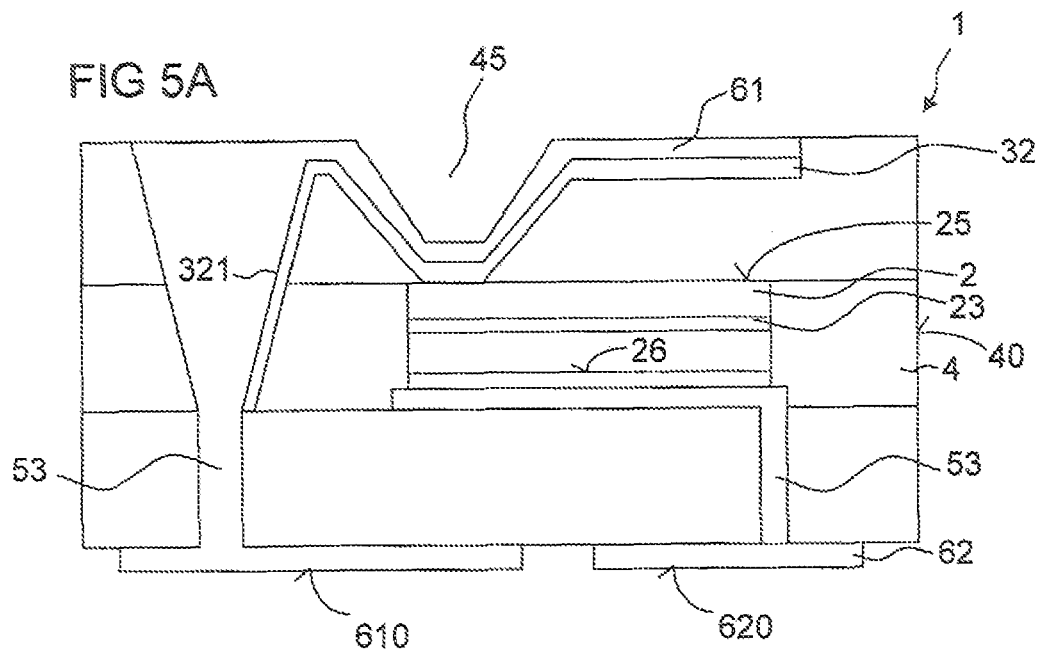
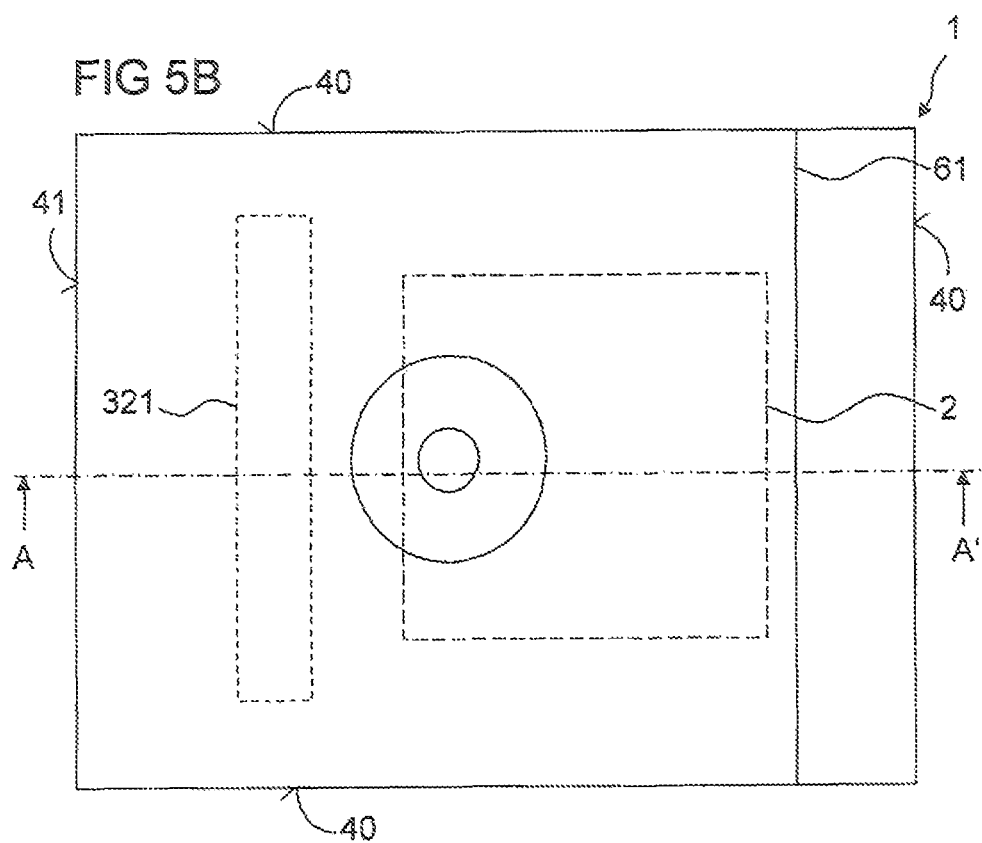

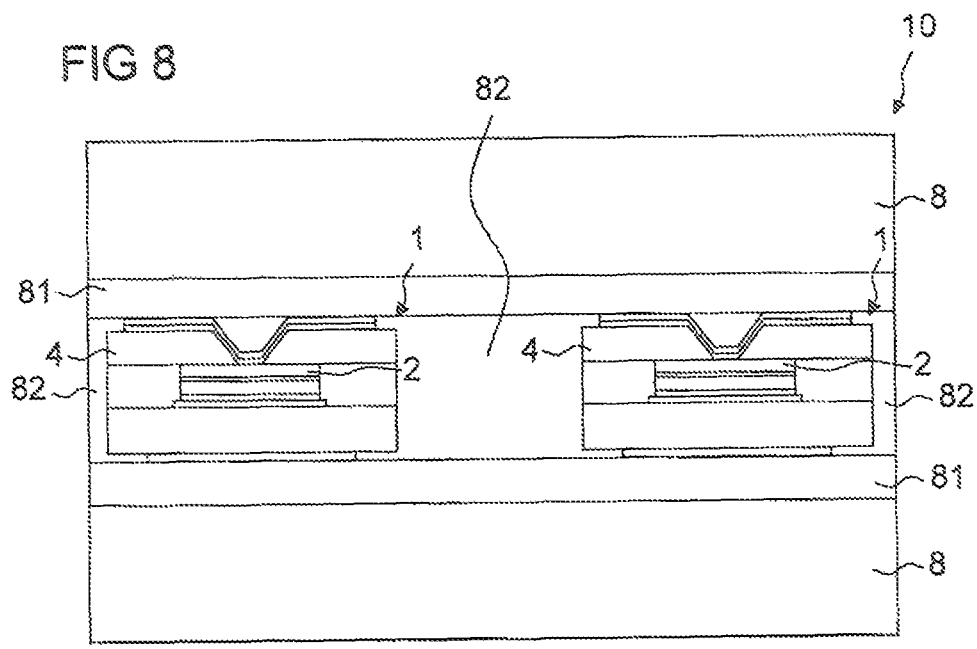
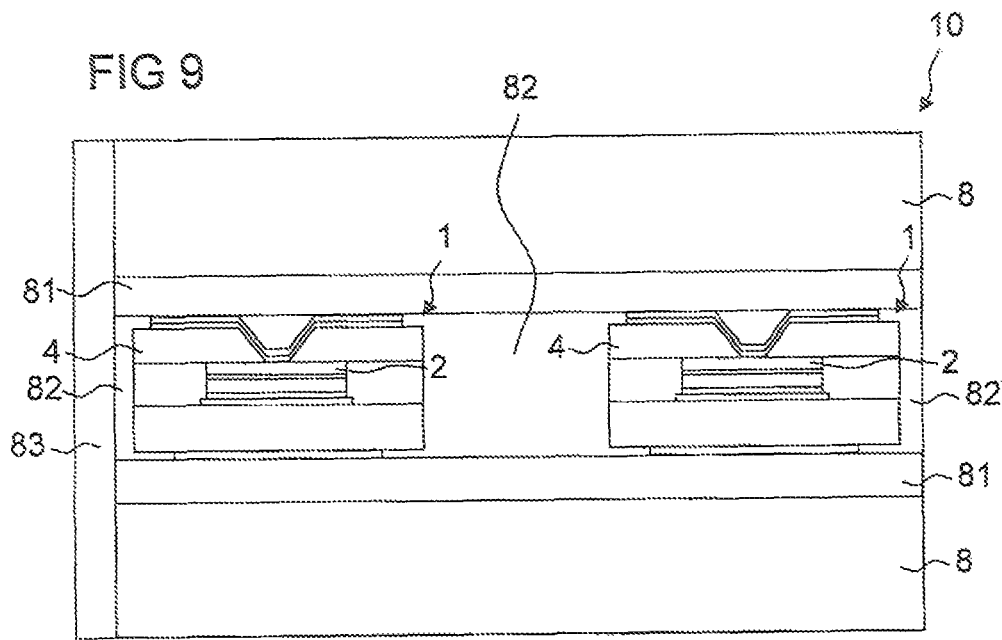

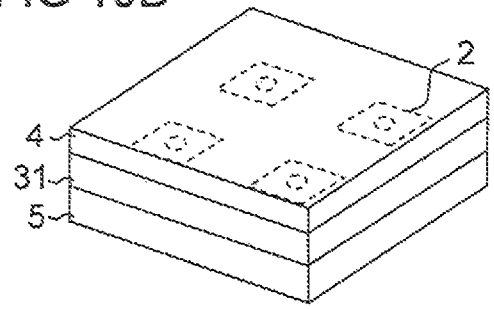
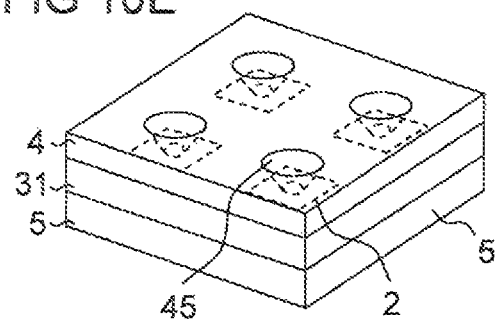
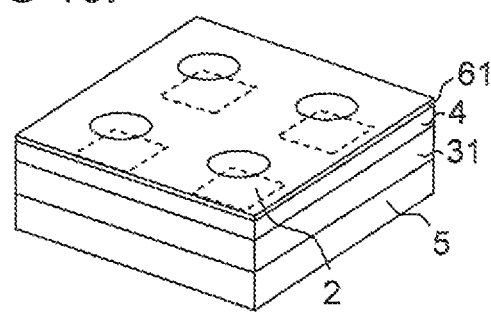

RADIATION-EMITTING COMPONENT AND METHOD FOR PRODUCING RADIATION-EMITTING COMPONENTS

RELATED APPLICATIONS

This is a §371 of International Application No. PCT/EP2011/062157, with an international filing date of Jul. 15, 2011 (WO 2012/010519, published Jan. 26, 2012), which is based on German Patent Application No. 10 2010 032 0412, filed Jul. 23, 2010, the subject matter of which is incorporated herein by reference.

TECHNICAL FIELD

This disclosure relates to a radiation-emitting component and to a method for producing radiation-emitting components.

BACKGROUND

For the backlighting of display devices such as liquid-crystal displays (LCDs) or introduction into light guides, for example, it is favorable for the radiation emitted by the radiation-emitting components to be emitted in the lateral direction, i.e., parallel to a mounting plane of the components. Comparatively complicated external optics are often used for this, which suitably deflect the radiation emitted by the radiation-emitting components.

It could therefore be helpful to provide a radiation-emitting component which emits radiation in the lateral direction and is formed compactly as well as a method by which radiation-emitting components can be produced in a simplified and reliable manner.

SUMMARY

We provide a radiation-emitting component including a semiconductor chip which has a first main surface, a second main surface on an opposite side from the first main surface and an active region that generates radiation, a carrier on which the semiconductor chip is fixed on the side of the second main surface, an output layer arranged on the first main surface of the semiconductor chip and forming a lateral output surface spaced apart from the semiconductor chip in a lateral direction, a recess tapering in a direction of the semiconductor chip being formed in the output layer and deflecting radiation emerging from the first main surface during operation into the direction of the lateral output surface.

We also provide a component arrangement including a multiplicity of the components, wherein at least a first component and a second component are arranged above one another in the vertical direction.

We further provide a component arrangement including a multiplicity of the components, wherein at least a first component and a second component are arranged next to one another in the lateral direction, the component arrangement having contact tracks arranged on opposite sides of the components and electrically interconnecting the components substantially parallel to one another.

We further yet provide a component arrangement including a multiplicity of the components, wherein the components are arranged between two plates, at least one of the plates being transparent or at least translucent for the radiation generated in the components.

We still further provide a method for producing a multiplicity of radiation-emitting components, including a) arranging a multiplicity of semiconductor chips on a carrier, b) applying a reflector layer into intermediate spaces between the semiconductor chips, c) forming an output layer including recesses in which a semiconductor chip is respectively exposed and which taper in the direction of the semiconductor chip, and d) singulation into the multiplicity of components, the output layer being cut through and each component having at least one semiconductor chip and one recess in the output layer.

We also further provide a radiation-emitting component including a semiconductor chip which has a first main surface, a second main surface on an opposite side from the first main surface and an active region that generates radiation, a carrier on which the semiconductor chip is fixed on the side of the second main surface, an output layer arranged on the first main surface of the semiconductor chip and forming a lateral output surface spaced apart from the semiconductor chip in the lateral direction, a recess formed in the output layer which deflects radiation emerging from the first main surface during operation in the direction of the lateral output surface, wherein the recess tapers in the direction of the semiconductor chip and extends through the output layer in a vertical direction, and a first contact structure formed on the output layer and electrically contacting the semiconductor chip through the recess in the output layer on the side of the first main surface.

BRIEF DESCRIPTION OF THE DRAWINGS

FIGS. 1A and 1B show a first example of a radiation-emitting component in schematic plan view (FIG. 1B) and associated sectional view (FIG. 1A).

FIG. 2 shows an example of a semiconductor chip for a radiation-emitting component.

FIG. 3 shows a second example of a radiation-emitting component in schematic plan view.

FIG. 4 shows a third example of a radiation-emitting component in schematic sectional view.

FIGS. 5A and 5B show a fourth example of a radiation-emitting component in schematic plan view (FIG. 5B) and associated sectional view (FIG. 5A).

FIG. 8 shows a third example of a component arrangement in schematic sectional view.

FIG. 9 shows a fourth example of a component arrangement in schematic sectional view.

FIGS. 10A to 10F show an example of a method for producing a radiation-emitting component with the aid of intermediate steps schematically shown in perspective representation.

DETAILED DESCRIPTION

Figure 6:
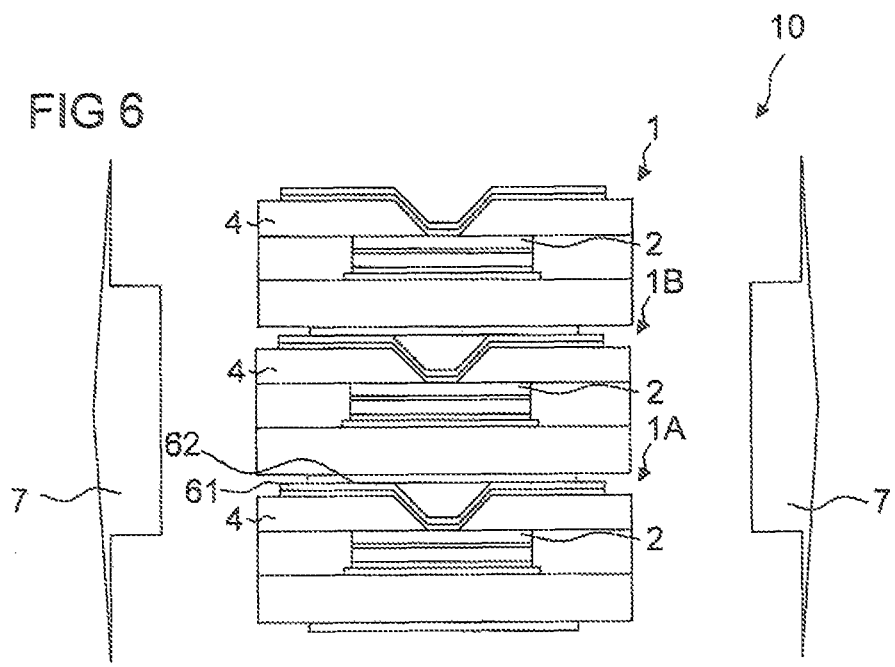
FIG. 6 shows a first example of a component arrangement in schematic sectional view.

Our radiation-emitting component has a semiconductor chip which has a first main surface, a second main surface on the opposite side from the first main surface and an active region that generates radiation. The component furthermore comprises a carrier on which the semiconductor chip is fixed on the side of the second main surface. An output layer is arranged on the first main surface of the semiconductor chip. The output layer forms a lateral output surface provided for output of the radiation from the component and is spaced apart from the semiconductor chip in the lateral direction, a recess tapering in the direction of the semiconductor chip being formed in the output layer and deflecting radiation emerging from the first main surface during operation of the component into the direction of the lateral output surface.

By the recess in the output layer, deflection of the radiation into a lateral direction thus takes place. A "lateral direction" means a direction which extends parallel to a main extent plane of the active region of the semiconductor chip.

In the lateral direction, the output layer is expediently bounded by the lateral output surface.

The recess is preferably spaced apart from the output surface. In a plan view on the radiation-emitting component, the recess preferably overlaps with the semiconductor chip.

The first main surface of the semiconductor chip preferably forms a main radiation exit surface for the semiconductor chip. This means that preferably at least 50% of the radiation generated in the semiconductor chip emerges from the semiconductor chip through the first main surface. The higher the fraction of the radiation emerging from the first main surface is, the greater the radiation fraction deflected deliberately into the lateral direction by the recess and can subsequently emerge from the lateral output surface. We found that with a semiconductor chip emitting predominantly in the vertical direction, that is to say in a direction extending perpendicularly to the main extent plane of the active region, output in the lateral direction can be achieved in a simplified and reliably controllable way.

Preferably, the semiconductor chip is at least locally surrounded by a reflector layer in the lateral direction, preferably along the entire circumference. By the reflector layer, the fraction of radiation which emerges from the first main surface of the semiconductor chip can be substantially increased. Furthermore, radiation propagating in the output layer can be reflected at the reflector layer and subsequently emerge from the component from the output surface.

The reflector layer is furthermore preferably electrically insulating. The risk of an electrical short circuit of the semiconductor chip is thereby substantially reduced. In particular, the reflector layer may be directly adjacent at least locally, or substantially along the entire circumference, to the semiconductor chip, in particular the active region.

Also preferably, a further reflector layer is arranged on an opposite side of the output layer from the reflector layer. In this case, the output layer is thus arranged between two reflector layers. By the reflector layers, it is possible to prevent radiation introduced into the output layer from emerging from the component in the vertical direction, i.e., in a direction extending perpendicularly to the lateral direction.

The reflector layer and/or the further reflector layer may, for example, contain a plastic formed to be reflective. Preferably, the plastic is provided with particles that increase reflectivity. For example, a silicone filled with particles, for example, with titanium dioxide particles, is suitable.

As an alternative or in addition, the reflector layer may also contain a layer of a metallic nature. In case of doubt, a "metallic nature" is intended to mean that the layer comprises a metal or a metal alloy and furthermore has a high reflectivity substantially independent of the angle of incidence of the radiation.

The reflector layer and the further reflector layer furthermore preferably extend parallel to one another at least locally, particularly in a region outside the recess. Guiding the radiation in the direction of the lateral output surface is thus simplified.

Further preferably, a first contact structure is formed on the output layer and electrically contacts the semiconductor chip through the recess in the output layer on the side of the first main surface. The first contact structure is used for external electrical contacting of the component. The first contact structure may also be formed with multiple layers. In particular, a layer of the first contact structure which faces toward the semiconductor chip may form the further reflector layer.

On the side facing away from the semiconductor chip, the first contact structure preferably comprises a layer to which a soldered connection can be produced in a simplified way. For example, a metal such as gold, nickel or tin or a metal alloy comprising at least one of the materials mentioned is suitable.

Expediently, the component furthermore has a second contact structure for electrical contacting of the semiconductor chip. By the first contact structure and the second contact structure, charge carriers can be injected during operation of the component from different sides into the active region, and recombine therein with the emission of radiation.

In particular, the second contact structure may be provided for electrical contacting of the semiconductor chip on the side of the second main surface. In this case, the first contact structure and the second contact structure preferably terminate the component in the vertical direction.

Preferably, the recess is formed in the shape of a funnel in a plan view on the component. In particular, the recess may be formed rotationally symmetrically, or at least substantially rotationally symmetrically. Furthermore, the recess may be arranged centrally with respect to the semiconductor chip. In this context, "centrally" means that an axis of the recess, extending in the vertical direction, passes through the centroid of the semiconductor chip or at least within a region around the centroid which has a radius of at most 10% of the maximum lateral extent of the semiconductor chip. The effect achieved by this in a simplified way is that the component has a uniform spatial emission characteristic in the lateral direction.

Preferably, the lateral output surface is at least locally curved, preferably convexly curved as seen from the outside, in plan view on the component. In particular, the output surface may be formed to be elliptical or round. A round output surface is suitable, particularly in combination with a recess which is funnel-shaped in plan view on the component and arranged centrally with respect to the semiconductor chip, for laterally uniform emission of the component.

The component may also have more than just one semiconductor chip. In this case, each semiconductor chip is preferably assigned at least one recess which tapers in the direction of the respective semiconductor chip.

Furthermore, a multiplicity of components having at least one of the features above may form a component arrangement.

According to a first example, at least a first component and a second component are arranged above one another in the vertical direction.

The first and second components respectively may have a first contact structure on the opposite side of the respective output layer from the semiconductor chip and a second contact structure on the opposite side of the component from the first contact structure, the first contact structure of the first component being furthermore preferably electrically conductively connected to the second contact structure of the second component. The first component and the second component can therefore be electrically interconnected in series with one another.

Alternatively, the first and second components respectively have a first contact structure and a second contact structure are provided to inject charge carriers into the active region from opposite directions, the first contact structure and the second contact structure extending in the vertical direction respectively through the carrier and through the output layer.

In particular, the first contact structure and/or the second contact structure may respectively extend fully through the respective component in the vertical direction. The contact structures can therefore respectively provide an external electrical contact on opposite sides of the component. By contact structures formed in such a way, components arranged above one another can be electrically interconnected in parallel with one another in a simplified way.

Alternatively, at least a first component and a second component are arranged next to one another in the lateral direction. The component arrangement preferably has contact tracks arranged on opposite sides of the components and at least partially electrically interconnect the components in parallel with one another.

Preferably, the components are arranged between two plates, at least one of the plates preferably being transparent or at least translucent for the radiation generated in the components.

The radiation emerging through the respective output surfaces of the components can be introduced into at least one of the plates and subsequently emerge therefrom over a large area. The plate therefore forms a flat emitter.

Preferably, a filler material which at least locally surrounds the components is arranged between the plates. With the filler material, it is possible to increase the fraction of the radiation emitted by the components and introduced into the plates.

Also preferably, at least one side surface of the plates is mirrored. The radiation generated during operation of the semiconductor chip can therefore be reflected at the mirrored side surface of the plates and emerge through one of the other side surfaces.

In a method for producing a multiplicity of radiation-emitting components, a multiplicity of semiconductor chips may be arranged on a carrier. A reflector layer may be applied into the intermediate spaces between the semiconductor chips. An output layer may be formed, the output layer comprising recesses in which a semiconductor chip is respectively exposed and which taper in the direction of the semiconductor chip. For singulation into the multiplicity of components, the output layer may be cut through and each component has at least one semiconductor chip and one recess in the output layer.

The method is preferably carried out in the order of the list above. Nevertheless, configurations in which a different order of the production steps is expedient may also be envisioned.

With the reflector layer, the carrier with the semiconductor chips can be at least partially planarized. The output layer therefore extends at least substantially in a plane.

The recesses may be formed by coherent radiation. In particular, laser radiation is suitable. As an alternative or in addition, an etching method may also be employed.

Alternatively, the output layer is already applied such that it comprises the recesses. This may, for example, be done with a mold shaped in accordance with the recesses. The mold may, for example, be filled with a molding method, an injection molding method or a transfer molding method.

The recess preferably forms a side surface at which the radiation generated in the component is reflected. An inclination angle of the side surface relative to the lateral plane is preferably 30° to 60°.

The described method is particularly suitable for the production of a component as described above. Features described in connection with the component or the component arrangement may therefore also be used for the method, or vice versa.

Other features, configurations and expediencies may be found in the following description of the examples in conjunction with the figures.

Elements which are the same or of a similar type, or which have the same effect, are provided with the same references in the figures.

The figures and the size proportions of the elements represented in the figures with respect to one another are not to be regarded as true to scale. Rather, individual elements, in particular layer thicknesses, may be represented exaggeratedly large for better representability and/or for better comprehension.

The first example of a radiation-emitting component 1, as represented in FIGS. 1A (sectional view along the line AA') and 1B, has a semiconductor chip 2 arranged on a carrier 5.

The semiconductor chip 2 is fixed on a mounting surface 51 of the carrier 5 with a mounting layer 52. A solder layer or an adhesive layer are suitable in particular for the mounting layer.

The semiconductor chip 2 has a first main surface 25 and a second main surface 26, on the opposite side from the first main surface. Between the first main surface 25 and the second main surface 26, an active region 23 provided to generate radiation is formed.

In the lateral direction, that is to say in a direction extending along a main exert plane of the active region 23, the semiconductor chip 2 is fully surrounded by a reflector layer 31. The reflector layer 31 is directly adjacent to the semiconductor chip 2 and is formed thereon during production.

By the reflector layer 31, radiation generated in the active region 23 during operation, which is emitted in the lateral direction and would emerge from the semiconductor chip 2 in the lateral direction, is reflected back into the semiconductor chip 2 and can subsequently emerge from the first main surface 25 of the semiconductor chip. By the reflector layer 31, the radiation power emerging overall from the first main surface 25 of the semiconductor chip can therefore be increased.

The thickness of the reflector layer 31, that is to say the extent of the reflector layer in the vertical direction, is formed such that the reflector layer 31 covers at least the active region 23. The reflector layer 31, however, need not necessarily terminate flush with the first main surface 25 of the semiconductor chip 2 in the vertical direction.

The reflector layer 31 is preferably formed to be electrically insulating. In particular, the reflector layer may contain a plastic, which may be provided with filler particles to increase the reflectivity. For example, the reflector layer 31 may be a silicone layer filled with titanium dioxide particles. Such a reflector layer may have a reflectivity of 85% or more, for example, 95% in the visible spectral range.

An output layer 4 is formed on the first main surface 25 of the semiconductor chip 2. In the lateral direction, the output layer 4 extends over the semiconductor chip 2 and also covers the reflector layer 31.

In the lateral direction, the output layer is bounded by a lateral output surface 40 provided for output of the radiation generated in the active region 23 from the component 1. In this example, the lateral output surface furthermore bounds the component 1 in the lateral direction fully in the vertical direction. The lateral output layer may, however, also only locally bound the component 1 in the lateral direction. For example, the carrier 5 may extend beyond the lateral output layer in the lateral direction.

In the output layer 4, a recess 45 is formed which extends in the vertical direction through the output layer. The recess 45 has a side surface 450 which is inclined relative to the lateral plane. At this side surface, radiation generated in the active region 23 and emerging from the first main surface 25 of the semiconductor chip 2 can be deflected into the direction of the lateral output surface 40. The side surface 450 is adjacent to the semiconductor chip. The radiation emerging from the semiconductor chip 2 is thus introduced directly into the output layer 4 and deflected therein when it encounters the recess 45.

The side surface 450 preferably makes an angle of 30° to 60° with the first main surface 25, preferably 35° to 55°.

A further reflector layer 32 is arranged on the opposite side of the output layer 4 from the semiconductor chip 2. The further reflector layer 32 covers at least the side surface 450 of the recess 45 and is used for improved radiation deflection into the direction of the lateral output surface 40. In a region adjacent to the output surface 40, the reflector layer 31 and the further reflector layer 32 extend parallel to one another.

In this example, the further reflector layer 32 is adjacent to the semiconductor chip 2 in the region of the recess 45. On the opposite side of the further reflector layer 32 from the semiconductor chip 2, a first contact structure 61 is arranged which forms an external electrical contact for the component 1. On the opposite side from the first contact structure, a second contact structure 62 is formed. During operation of the radiation-emitting component, charge carriers can be injected by the first contact structure 61 and the second contact structure 62 from different sides into the active region 23 of the semiconductor chip 2, and recombine therein with the emission of radiation.

In this example, the further reflector layer 32 is formed to be electrically conductive. Preferably, the further reflector layer is of a metallic nature and contains a metal, or a metal alloy comprising at least one metal having a high reflectivity for the radiation to be generated in the active region. In the visible spectral range, for example, aluminum, silver, rhodium, palladium and chromium have a high reflectivity. For the infrared spectral range, gold is, for example, suitable.

The first contact structure 61 and the second contact structure 62 are respectively formed, at least on the side facing away from the semiconductor chip 2, such that the component can be externally electrically contacted in a simplified way, for example by a soldered connection. The first contact structure and the second contact structure preferably contain a metal, for example, silver, aluminum, palladium, nickel, platinum, gold or titanium, or a metal alloy comprising at least one of the materials mentioned.

The electrical contacting of the semiconductor chip on the side of the second main surface 26 is carried out through the carrier 5 in this example. The carrier 5 preferably has a high electrical conductivity and furthermore a high thermal conductivity. In particular, the carrier may contain or consist of a metal, for example, copper. The carrier 5 may, for example, be produced from a metal sheet, for example, a copper sheet. The carrier can be fully unstructured and is therefore particularly simple and economical to produce.

Unlike in the example shown, the carrier 5 may be provided for direct external contacting so that the carrier 5 itself may form the second contact structure. An additional layer for forming the second contact structure is not necessary in this case.

In a plan view of the component 1, the recess 45 is formed in the shape of a funnel, the funnel being configured rotationally symmetrically. Furthermore, the recess 45 is arranged centrally with respect to the semiconductor chip 2. Uniform emergence of radiation in the lateral direction can thus take place through the lateral output surfaces 40. The emission takes place in every direction in the lateral plane, i.e., over 360° around the semiconductor chip. Depending on the emission characteristic intended for the component, however, different positioning relative to the semiconductor chip 2 and/or a configuration of the recess 45 differing from rotational symmetry may also be expedient.

The described component 1 is particularly suitable, in particular owing to its lateral emission and the compact structure, for direct backlighting of a display device, instance an LCD (liquid-crystal display) or for introduction into a light guide.

FIG. 2 shows a schematic sectional view of an example of a semiconductor chip 2 which is particularly suitable for the components described above and below.

The semiconductor chip 2 has a semiconductor body 20 comprising a semiconductor layer sequence. The semiconductor layer sequence which forms the semiconductor body 20 comprises a first semiconductor region 21 and a second semiconductor region 22 which expediently have different conduction nines from one another. An active region 23 provided to generate radiation is formed between the first semiconductor region and the second semiconductor region.

The semiconductor body 20 is arranged on a substrate 27. The substrate is different to a growth substrate for the semiconductor layer sequence of the semiconductor body 20. The substrate 27 is used, in particular, for mechanical stabilization of the semiconductor body 20. The growth substrate for the semiconductor layer sequence is no longer necessary for this purpose. The semiconductor chip 2 is therefore free from the growth substrate. The substrate may, for example, contain a semiconductor material, for instance silicon, germanium or gallium arsenide, or consist of a semiconductor material.

A semiconductor chip from which the growth substrate is removed is also referred to as a thin-film semiconductor chip.

A thin-film semiconductor chip, for instance a thin-film light-emitting diode chip, may furthermore be distinguished by at least one of the following characteristics:

on a first main surface which faces toward a carrier element, for example, the substrate 27 of a semiconductor body comprises a semiconductor layer sequence having an active region, in particular an epitaxial layer sequence, a mirror layer is applied or formed, for instance by being integrated as a Bragg mirror in the semiconductor layer sequence, and reflects at least a part of the radiation generated in the semiconductor layer sequence back into the latter;

the semiconductor layer sequence has a thickness of 20 μm or less, particularly of 10 μm and/or;

the semiconductor layer sequence contains at least one semiconductor layer comprising at least one surface which has a mixing structure, which in the ideal case leads to approximately ergodic distribution of the light in the semiconductor layer sequence, that is to say it has a scattering behavior which is as ergodically stochastic as possible.

A basic principle of a thin-film light-emitting diode chip is described, for example, in I. Schnitzer et al., Appl. Phys. Lett, 63(16), Oct. 18, 1993, 2174-2176, the subject matter of which is incorporated by reference.

A bonding layer 28 by which the semiconductor body is fixed on the substrate 27 is arranged between the substrate 27 and the semiconductor body 20. Furthermore, a mirror layer 29 preferably of metallic nature is formed between the semiconductor body 20 and the substrate 27, which is provided to deflect radiation generated in the active region 23, and emitted in the direction of the substrate 27, toward the first main surface.

A thin-film semiconductor chip is distinguished in particular in that the predominant radiation fraction, that is to say at least 50% of the emitted radiation, emerges on the side of the first main surface.

Unlike in the example described, it is however also possible, for example, to use a semiconductor chip in which the growth substrate forms the substrate for the semiconductor layer sequence of the semiconductor body. A bonding layer between the substrate 27 and the semiconductor body 20 is not necessary in this case.

For electrical contacting, the semiconductor chip 2 has a first terminal 24a which forms the first main surface of the semiconductor chip. On the opposite side from the first terminal 24a, a second terminal 24b is arranged on the second main surface 26 of the semiconductor chip. The semiconductor chip can therefore be externally electrically contacted from opposite sides.

The semiconductor chip 2, in particular the active region 23, preferably contains a III-V semiconductor material. III-V semiconductor materials are particularly suitable for radiation generation in the ultraviolet ($Al_xIn_yGa_{1-x-y}N$) through visible ($Al_xIn_yGa_{1-x-y}N$, in particular for blue to green radiation, or $Al_xIn_yGa_{1-x-y}P$, in particular for yellow to red radiation) to infrared ($Al_xIn_yGa_{1-x-y}As$) spectral ranges. Respectively, $0 \leq x \leq 1$, $0 \leq y \leq 1$, and $x+y \leq 1$, in particular with $x \neq 1$, $y \neq 1$, $x \neq 0$ and/or $y \neq 0$. With III-V semiconductor materials, in particular consisting of the material systems mentioned, high internal quantum efficiencies can furthermore be achieved in the radiation generation.

A second example of a radiation-emitting component is represented in FIG. 3 with the aid of a schematic plan view. This second example corresponds essentially to the first example as described in connection with FIGS. 1A and 1B. In contrast thereto, the lateral output surface 40 is formed to be round in plan view. The effect achieved is that radiation reflected into the radial direction at the recess 45 perpendicularly strikes the lateral output surface 40 all around and can therefore be output from the component 1 with a high efficiency.

In the case of such a round lateral output surface 40, the carrier 5 preferably has a shape different to that of the lateral output surface, and in this example the shape of a regular hexagon in plan view. The effect achieved is that the components 1 have a border comprising straight subsections during production, despite the curved lateral output surface 40. Owing to such straight subsections, the components can be singulated in a simplified way during production, for example, mechanically for instance by sawing, cleaving or fracture.

To further increase the homogeneity of the emission characteristic in the lateral direction, the first main surface 25 of the semiconductor chip may additionally be configured rotationally symmetrically in plan view so that the radiation generated in the active region enters the output layer 4 with a rotationally symmetrical or at least essentially rotationally symmetrical radiation density.

A third example of a component is schematically represented in sectional view in FIG. 4. This third example corresponds essentially to the first example as described in connection with FIGS. 1A and 1B. In contrast thereto, the first contact structure 61 is directly adjacent to the semiconductor chip 2 in the region of the recess 45. The electrical contacting of the semiconductor chip is therefore not carried out through the further reflector layer 32. The latter can therefore also be formed to be electrically insulating, and in particular the further reflector layer 32 may be formed to be of the same type as the reflector layer 31. The output layer 4 can therefore be at least locally adjacent on both sides to a reflector layer which can be produced in a straightforward way, for example, by a dispenser or a molding method.

The fourth example of a component 1, as schematically represented in FIGS. 5A and 5B, corresponds essentially to the first example as described in connection with FIGS. 1A and 1B. In contrast thereto, the first contact structure 61 forms a first contact surface 610 on the side of the carrier 5 facing away from the semiconductor chip 2. With the first contact surface 610 and a second contact surface 620 of the second contact structure 62, the radiation-emitting component can thus be contacted on the lower side with two contacts. The first contact structure 61 and the second contact structure 62 respectively extend through recesses 53 in the carrier 5 and form an electrical terminal for the semiconductor chip on the side of the first main surface 25, and respectively on the side of the second main surface 26 of the semiconductor chip 2.

In this example, the carrier 5 may also be formed to be electrically insulating. For example, the carrier may contain a ceramic, for instance aluminum nitride or boron nitride, or a plastic, or it may consist of such a material. By a ceramic, it is possible to produce a carrier which has a high thermal conductivity so that waste heat generated during operation can be dissipated efficiently from the semiconductor chip 2.

Furthermore, the component is not intended for all-round emission, but has by way of example only three lateral output surfaces 40. Radiation emitted in the direction of a further side surface 41 is deflected into the direction of the lateral output surfaces 40 by a lateral reflector 321.

The lateral reflector 321 in this example is formed by a region of the further reflector layer 32, which region passes through the output layer 4.

With the shape of the lateral reflector 321, it is possible to adjust the emission characteristic of the component 1. For example, the lateral reflector 321 may be configured with a U-shape in plan view so that the emission of the radiation-emitting component essentially takes place only through one lateral output surface 40.

Furthermore, in contrast to the first example, the recess 45 in the output layer 4 is displaced as seen from the centroid of the semiconductor chip 2 in the direction of the further side surface 41 not intended for the emission. Directional emission away from the further side surface is thereby substantially promoted.

FIG. 6 shows a first example of a component arrangement which comprises a multiplicity of radiation-emitting components 1, each of which is configured as described in connection with FIGS. 1A and 1B. The component arrangement 10 comprises, by way of example, three radiation-emitting components 1 arranged above one another in the vertical direction. In this case, a first contact structure 61 of a first component 1A is electrically conductively connected to a second contact structure 62 of a second component 1B, for example, by a bonding layer, for instance a solder or an electrically conductive adhesive not explicitly represented). The components 1A, 1B arranged above one another are thus electrically interconnected in series with one another without wired connections. An arrow 7 illustrates the radiation emitted overall by the component arrangement 10 in the lateral direction.

Figure 7:
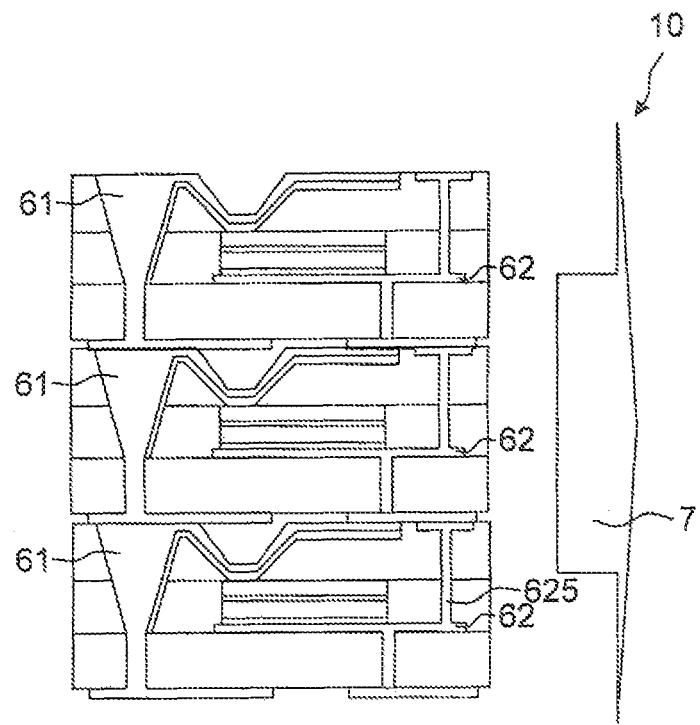
FIG. 7 shows a second example of a component arrangement in schematic sectional view.

A second example of a component arrangement is schematically represented in sectional view in FIG. 7. This component arrangement 10 comprises a multiplicity of components 1 arranged above one another in the vertical direction as in the first example. The components 1 correspond essentially to the components according to the fourth example, which is described in connection with FIGS. 5A and 5B.

In contrast thereto, the second contact structure 62 of the components 1 respectively has a through-contact 625. The through-contact extends respectively through the output layer 4. Each component 1 therefore provides a first contact structure 61 and a second contact structure 62, which extend fully through the component 1 in the vertical direction. The first contact structures 61 and the second contact structures 62 of successive components 1 are respectively connected electrically conductively to one another so that the components 1 of the component arrangement 10 are electrically interconnected in parallel with one another. By the described configuration of the contact structures 61, 62, components 1 arranged above one another in the vertical direction can thus be electrically interconnected in parallel with one another without additional external electrical connection lines being required therefor.

The radiation power emitted overall in the lateral direction (arrow 7) may thus be increased by radiation-emitting components, in particular configured identically or at least in a similar way, being stacked in the vertical direction.

FIG. 8 shows a third example of a component arrangement 10 in which the components 1 are configured essentially as in the first example as described in connection with FIGS. 1A and 1B.

The component arrangement 10 comprises a multiplicity of components 1 arranged next to one another in the lateral direction.

The radiation-emitting components 1 are arranged between two plates 8. By contact tracks 81, the components 1 are electrically interconnected in parallel with one another. The contact tracks 81 may, for example, respectively be formed as a continuous surface-wide transparent, or at least translucent, contact layer. For example, the contact layer may contain a transparent conductive oxide (TCO). As an alternative or in addition, metal contact tracks may be provided on the plates 8, which contact tracks may be so thin that they are no longer perceived by the human eye at a given distance. For example, the contact tracks may contain copper or consist of copper.

Between the components 1, a filler material 82 is arranged which is provided to introduce radiation emitted by the components 1 into the plates 8. Preferably, the filler material 82 has a refractive index which lies in the region of the refractive index of the plates. During operation of the component arrangement 10, the radiation generated by the components 1 can be output by the plates 8 so that a component arrangement having a large-area emission surface is produced in a straightforward way.

The fourth example of a component arrangement, as represented in FIG. 9, corresponds essentially to the third example as described in connection with FIG. 8. In contrast thereto, the component arrangement 10 has a mirror 83 which prevents emission through a side surface of the component arrangement. It is also possible for a plurality of side surfaces of the component arrangement 10 to have a mirror 83 so that the radiation power emerging overall from the component arrangement 10 through the unmirrored surfaces can be increased. For the mirrors, one of the materials described in connection with the reflector layers 31, 32 is suitable in particular.

Unlike in the example described, at least one of the plates may also have indentations in which the semiconductor chips are arranged. Radiation emerging laterally from the semiconductor chips can thus be introduced into the plate through a side surface of the indentations.

An example of a method of producing radiation-emitting components is schematically shown in FIGS. 10A to 10F with the aid of intermediate steps represented in perspective. For simplified representation, only a part from which a component is obtained during production is shown. The production is represented by way of example for a component comprising four semiconductor chips 2. The number of semiconductor chips per component is however, freely selectable within wide limits. In particular, the radiation-emitting component 1 may also comprise just one semiconductor chip 2.

Figure 10A:
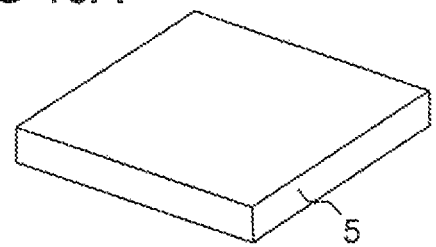

As represented in FIG. 10A, a carrier 5 is provided, for example, in the form of a metal sheet, for instance a copper sheet.

Figure 10B:
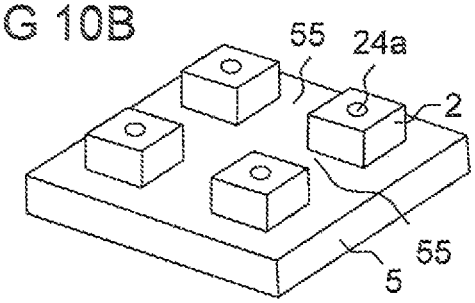
Figure 10C:
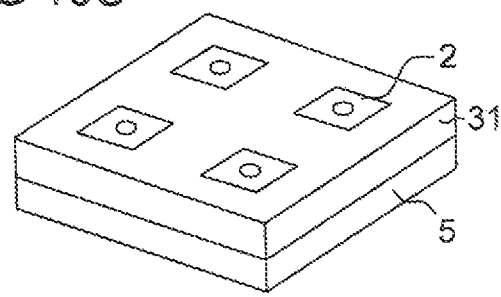

Semiconductor chips 2 are arranged on the carrier 5 (FIG. 10B). On the side which faces toward the carrier 5, the semiconductor chips 2 are electrically conductively connected to the carrier 5, for example, by a solder layer or an adhesive layer (not explicitly represented). The intermediate spaces 55 between the semiconductor chips 2 are filled by a casting compound which forms a reflector layer 31 (FIG. 10C). With the casting compound, the carrier 5 with the semiconductor chips 2 is thus planarized. The reflector layer 31 need not, however, necessarily terminate flush with the semiconductor chip 2 on the side which faces away from the carrier 5. In particular, a first main surface of the semiconductor chip which faces away from the carrier 5 may also be covered at least locally with the reflector layer.

Deposition of the reflector layer 31 may, for example, be carried out by a dispenser. As an alternative, a different method may also be employed, for example, a molding method, an injection molding method or a transfer molding method.

For example, a silicone layer filled with titanium dioxide particles is suitable as the material for the first reflector layer 31. With an increasing fill factor, the reflectivity of the reflector layer can be increased so that it is 90% or more, preferably 95% or more.

An output layer 4 is subsequently applied, as represented in FIG. 10D. The output layer 4 expediently contains a material which is transparent or at least translucent for the radiation generated in the semiconductor chip. A luminescent conversion material or a diffusor material may also be embedded in the output layer to control the spectral and/or spatial emission characteristic.

In the case of an embedded luminescent conversion material, the heat losses incurred in this material during operation can be dissipated efficiently by the first contact structure 61 and optionally by the further reflector layer 32.

A polymeric material, for example, a silicone, an epoxide or a mixture of a silicone and an epoxide is suitable in particular for the output layer 4. Recesses 45 are formed in the output layer 4, the recesses 45 respectively extending, through the output layer 4 to a semiconductor chip 2. The recesses are formed in such a way that they taper in the direction of the semiconductor chip 2. This may, for example, be achieved by means of coherent radiation, for instance laser radiation. As an alternative, a chemical method may also be employed, for instance a wet chemical etching method.

In contrast to this the output layer 4 may also be applied such that it already comprises the recesses 45. To this end, a mold may be used which is shaped in accordance with the recesses so that the mold is adjacent to the semiconductor chip 2 in the region of the recesses.

The mold may for example, be filled by molding, injection molding or transfer molding.

As represented in FIG. 10F, a first contact structure 61 is formed on the output layer for example, by evaporation coating or sputtering.

Before application of the first contact structure 61, the exposed surface of the semiconductor chip may be cleaned, for example, by coherent radiation so that reliable contacting takes place.

The first contact structure 61 is used for electrical contacting of the semiconductor chip from the side facing away from the carrier 5. The first contact structure 61 may also be formed with multiple layers, in which case a first layer facing toward the output layer 4 may be formed as a further reflector layer. For example, layer sequences such as titanium/nickel/palladium/gold or titanium/nickel/gold are suitable.

If required, the layer of the first contact structure 61 which is adjacent to the semiconductor chip 2 may be reinforced by an electrolytic deposition method.

During production, a plurality of radiation-emitting components 1 are produced next to one another. The singulation of the components may, for example, be carried out mechanically, for instance by sawing, cutting or fracture and/or chemically, for instance by etching. Coherent radiation may also be employed for the singulation.

During the singulation, the output layer 4 is in particular cut through, in which case the cleavage surfaces may form the lateral output surfaces 40 of the component 1.

With the described method, radiation-emitting components which emit radiation in the lateral direction during operation can be produced in a particularly straightforward and reliable way. The vertical extent of the output surface may in this case be adjusted during production by suitable selection of the layer thickness of the output layer 4. Thus, the radiation/emitting components 1 can be formed in a straightforward way, for example while being adapted to a given light guide. Separate optical devices for deflecting the radiation emitted by the radiation-emitting component 1 can be obviated.

Our components and methods are not limited by this disclosure with the aid of the examples. Rather, this disclosure covers any new feature and any combination of features, which includes in particular any combination of features in the appended claims, even if the feature or combination is not explicitly indicated per se in the claims or examples.

The invention claimed is:

1. A radiation-emitting component comprising:
   a semiconductor chip having a first main surface, a second main surface on an opposite side from the first main surface and an active region that generates radiation;
   a carrier on which the semiconductor chip is fixed on the side of the second main surface;
   an output layer arranged on the first main surface of the semiconductor chip and forming a lateral output surface spaced apart from the semiconductor chip in a lateral direction, a recess tapering in a direction of the semiconductor chip being formed in the output layer and deflecting radiation emerging from the first main surface during operation into the direction of the lateral output surface; and
   a first contact structure formed on the output layer and electrically contacting the semiconductor chip through the recess in the output layer on the side of the first main surface.

2. The radiation-emitting component according to claim 1, wherein the semiconductor chip is at least locally surrounded by a reflector layer in the lateral direction.

3. The radiation-emitting component according to claim 2, wherein the reflector layer is electrically insulating and at least locally is directly adjacent to the semiconductor chip.

4. The radiation-emitting component according to claim 2, further comprising a second reflector layer arranged on an opposite side of the output layer from the reflector layer.

5. The radiation-emitting component according to claim 1, wherein the recess is formed in a funnel shape in plan view on the component and is arranged centrally with respect to the semiconductor chip.

6. The radiation-emitting component according to claim 1, wherein the lateral output surface is at least locally curved in plan view on the component.

* * * * *